United States Patent [19]

McDavid

[11] Patent Number: 4,628,588

[45] Date of Patent: Dec. 16, 1986

[54] MOLYBDENUM-METAL MASK FOR DEFINITION AND ETCH OF OXIDE-ENCAPSULATED METAL GATE

[75] Inventor: James M. McDavid, Dallas, Tex.

[73] Assignee: Texas Instruments Incorporated, Dallas, Tex.

[21] Appl. No.: 624,081

[22] Filed: Jun. 25, 1984

[51] Int. Cl.$^4$ .................. H01L 21/283; H01L 21/308
[52] U.S. Cl. ........................................ 29/571; 29/578; 29/591; 148/DIG. 105; 148/DIG. 106; 156/656
[58] Field of Search ...................... 29/571, 578, 577 C, 29/591; 148/DIG. 103, DIG. 105, DIG. 106; 156/656

[56] References Cited

U.S. PATENT DOCUMENTS 3,698,078 10/1972 Redington ............................ 29/578
4,453,306 6/1984 Lynch et al. ......................... 29/571

Primary Examiner—Brian E. Hearn
Assistant Examiner—Alan E. Schiavelli
Attorney, Agent, or Firm—John G. Graham

[57] ABSTRACT

A molybdenum mask is used instead of a photoresist mask in defining and etching an oxide-encapsulated molybdenum gate in a VLSI manufacturing method. The molybdenum mask is first defined by a photoresist mask, then the photoresist is removed, leaving the molybdenum mask. A long over etch can then be tolerated so that oxide filaments can be avoided; this would be otherwise unreliable due to damage to photoresist during the over etch.

8 Claims, 4 Drawing Figures

MOLYBDENUM-METAL MASK FOR DEFINITION AND ETCH OF OXIDE-ENCAPSULATED METAL GATE

BACKGROUND OF THE INVENTION

This invention relates to manufacture of VLSI semiconductor devices, and more particularly to a method of etching for metal-gate devices.

In the manufacture of MOS VLSI devices such as 1-Megabit dynamic RAMs, for example, refractory metal gates are used, and these gates may have an overlying oxide coating needed for encapsulating the metal gate during a siliciding operation. This oxide coating presents problems, however, due to the tendancy to leave filaments of oxide at steps in the topography of the face of the silicon slice. The filaments would mask the etching of the molybdenum when the gates are patterned, thus leaving metal shorts which would cause the devices to fail.

It is the object of this invention to provide improved methods of making VLSI semiconductor devices, particularly such devices having refractory metal gates. Another object is to provide a method of VLSI manufacture which will tolerate lengthy etch steps without degrading the etch mask.

SUMMARY OF THE INVENTION

Metal gate VLSI devices which use an oxide overlayer on the metal gate material, where the oxide is present at the pattern of the gate level and where the oxide becomes part of the encapsulation for the gate, can have a fabrication complication resulting in breakdown of photoresist. This breakdown of polymer resist is due to the very long etch times required to remove oxide from the sidewall of a vertical step. Failure to remove that oxide results in a metal short from material masked by the oxide during the metal etch. This invention provides a method of accomplishing the etch of an oxide/molybdenum stack by depositing an additional thin molybdenum layer over the oxide. This molybdenum layer is patterned and etched, then the resist is removed, with the thin molybdenum layer serving to mask the oxide in a subsequent etch step. The thin moly mask layer is automatically removed during the etch of the molybdenum gate, which is itself masked by the oxide. An analogous procedure applies to gate materials other than molybdenum.

BRIEF DESCRIPTION OF THE DRAWINGS

The novel feature believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
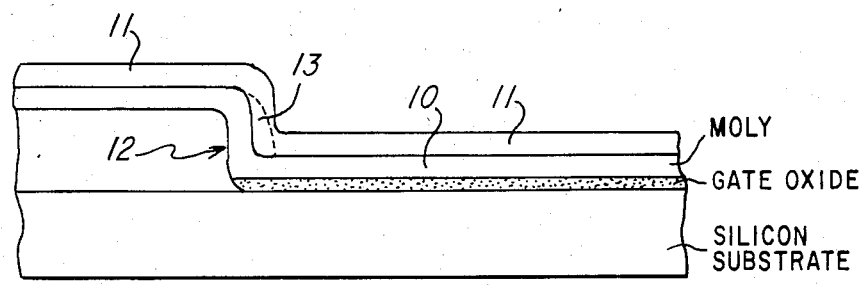
FIGS. 1-4 are elevation views in section, greatly enlarged, of a small part of a silicon slice, at various stages in the manufacture thereof according to the invention.

Referring to FIG. 1, a process for making VLSI semiconductor devices, for example 1-Megabit DRAMs and the like, requires patterning a layer 10 of molybdenum to form the gates of metal-gate MOS transistors. This layer 10 has an overlying layer 11 of silicon oxide at the time of the etch used for patterning. A step 12 in the underlying topology may be due to a first level polysilicon structure, a field oxide area, or a conductor and/or insulator structure of various types. When etching the molybedenum and oxide stack 10 and 11, at the edge of the step 12 a filament 13 (as indicated by dotted lines) would tend to be left in place due to the anisotropic nature of the etch. To avoid leaving this filament 13, the etch time must be excessively long.

Figure 2:
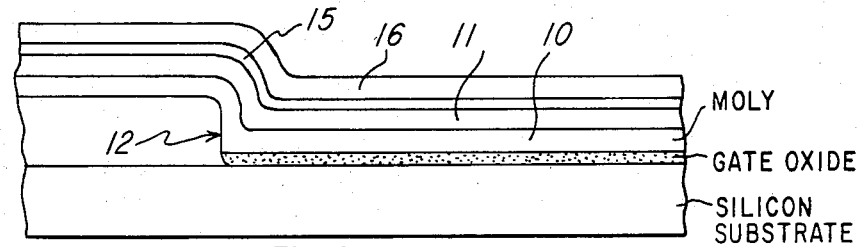
Figure 3:
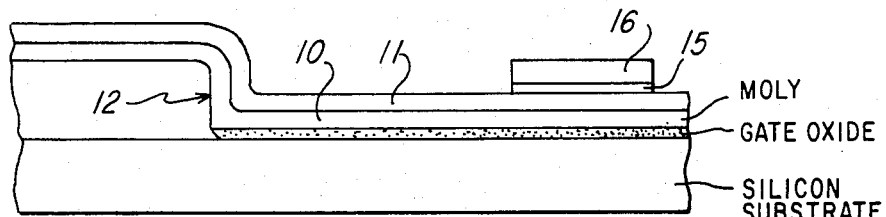

According to the invention, to avoid damage to the photoresist masking occuring during this long overetch, a thin molybdenum metal layer 15 is applied over the oxide 11 as seen in FIG. 2. The photoresist material 16 is then applied over the layer 15, then exposed to light and developed to leave the pattern in place which is to be the etch mask. As seen in FIG. 3, the resist mask 16 is then used to selectively remove the metal layer 15, and the resist 16 is then removed by stripping, leaving the structure of FIG. 4. The oxide 11 can then be etched using the remaining moly 15 as a mask, and this mask will be much less susceptable to being damaged by a long over-etch. Likewise, the underlying moly layer 10 is also etched using the oxide 11 as a mask, and the thin moly layer 15 will be removed by the same etch that removes the moly 10. The remaining moly 10 and cap oxide 11 is a transistor gate, and is subsequently used as a self-aligned mask for source/drain implant. This gate may be spaced from the step, or it may be a strip extending along the face and down across the step.

Figure 4:
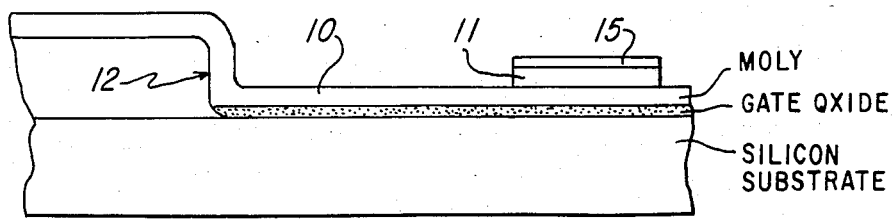

Note that if the oxide 11 is not completely removed at the sidewall 13, then the metal 10 might not be completely removed by the etch of FIG. 4, and so a metal short could result that would be a catastrophic fault. Therefore, the oxide etch must be long enough to assure the complete removal of such oxide.

The purpose of the oxide layer 11 in the structure illustrated is for encapsulating the molybdenum in a subsequent siliciding operation. As in my copending application Ser. No. 624,165, filed herewith, the same concept as described above would be useful in other manufacturing processes, such as those using other refractory metals such as tungsten or tantalum as the metal gates of MOS transistors or the like, and indeed by any structure where long etch times are needed which might damage photoresist.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a semiconductor device comprising the steps of:
    applying a layer of refractory metal to a face of a semiconductor body, said face of the semiconductor body having two relatively flat surfaces with a substantially vertical step between the flat surfaces, said layer of refractory metal extending along said face from one flat surface to the other by said step,
    "applying a layer of insulator over said layer of refractory metal,"

applying a thin coating of molybdenum over said layer of insulator, said coating being resistant to an etchant which etches said insulator, applying a layer of photoresist over said molybdenum coating, exposing to light and developing the photoresist, to leave an area of said photoresist spaced from said step or to leave a line of said photoresist crossing said step, etching away said molybdenum coating using said area of photoresist as a mask, then removing said area of photoresist to leave an area of said molybdenum coating, then etching said insulator using said area of molybdenum coating as a mask, to remove the uncovered insulator coating including filament areas at said step, and thereafter etching said layer of refractory metal.

2. A method according to claim 1 wherein said refractory metal is molybdenum.

3. A method according to claim 1 wherein said layer of insulator is silicon oxide.

4. A method according to claim 1 wherein said refractory metal is molybdenum, and said layer of insulator is silicon oxide.

5. In a method of making an MOS transistor device, the steps of:

applying a layer of conductive material to a face of a semiconductor body, said face of the semiconductor body having a substantially vertical step between two relatively flat surfaces, said layer extending across a step, applying a layer of insulator over said layer of conductive material, applying a thin molybdenum coating over said layer of insulator, said molybdenum coating being resistant to an etchant which etches said insulator, applying a layer of photoresist over said molybdenum coating, exposing to light and developing the photoresist, to leave an area of said photoresist spaced from said step, etching away said molybdenum coating using said area of photoresist as a mask, then removing said area of photoresist to leave an area of said molybdenum coating, then etching said insulator using said area of molybdenum coating as a mask, to remove the uncovered insulator coating including filament areas at said step, and thereafter etching said layer of conductive material.

6. A method according to claim 5 wherein said conductive material is a refractory metal.

7. A method according to claim 5 wherein said layer of insulator is silicon oxide.

8. A method according to claim 6 wherein said conductive material is molybdenum, and said layer of insulator is silicon oxide.

* * * * *